DOUBLE HEAT SINK SEMICONDUCTOR DIODE WITH GLASS ENVELOPE

Original Filed Jan. 2, 1964

INVENTORS:
THOMAS R. SELIG,
PHILIP C. WHITMAN,
BY Robert J. Mooney
THEIR ATTORNEY.

3,381,185

DOUBLE HEAT SINK SEMICONDUCTOR DIODE WITH GLASS ENVELOPE

Philip C. Whitman and Thomas R. Selig, Liverpool, N.Y., assignors to General Electric Company, a corporation of New York Continuation of application Ser. No. 335,058, Jan. 2, 1964. This application Mar. 23, 1967, Ser. No. 625,558
3 Claims. (Cl. 317—234)

This is a continuation of application Ser. No. 335,058, filed Jan. 2, 1964, now abandoned.

The present invention relates to improvements in semiconductor signal diodes.

A principal object of the present invention is to provide an improved semiconductor junction signal diode which has a very low manufacturing cost and is physically diminutive yet exceptionally resistant to mechanical and thermal shock.

Another object is to provide a semiconductor diode of the foregoing character which is particularly suited for low cost assembly.

Another object is to provide such a semiconductor diode which includes a hermetically sealed envelope of soft, or relatively low sealing temperature, glass.

Another object is to provide a semiconductor diode of the foregoing character of which all the parts may be assembled by a single heating operation which can be conducted in air and which simultaneously hermetically seals the glass envelope.

Figure 1:
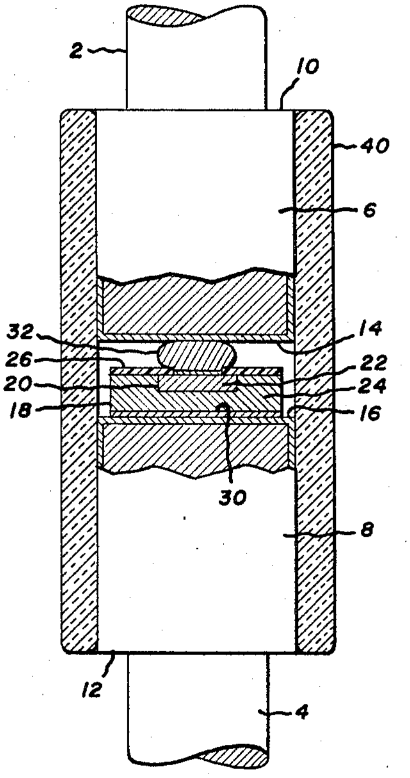
Figure 2:
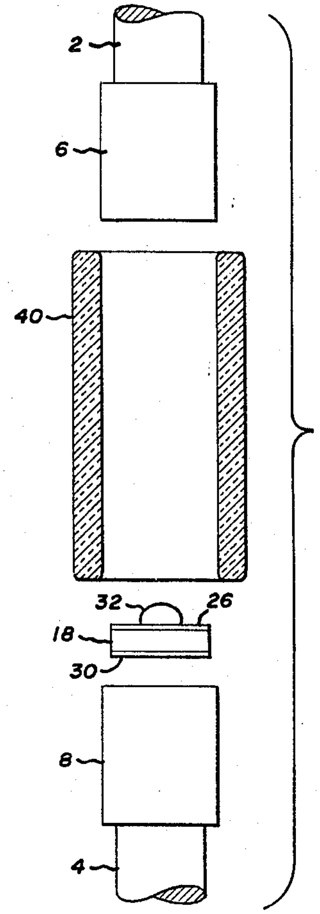

These and other objects of the present invention will be apparent from the following description together with the accompanying drawing in which:

FIGURE 1 is a fragmentary view, partially broken away in axial section, of a semiconductor signal diode constructed in accordance with the present invention; and FIGURE 2 is an axially exploded view, to a diminished scale, of the structure of FIGURE 1.

Referring to FIGURE 1 of the drawing, a semiconductor signal diode constructed in accordance with our invention includes two identical substantially coaxially arranged oppositely extending wire leads 2, 4 of a metallic composition having a low electric resistivity and capable of being easily hermetically sealed to a "soft" glass, i.e., a glass such as Corning 0120 or Kimble KG12 having a working point of less than about 1000° C., and a softening point of less than about 750° C. A preferred material for leads 2 and 4 is a copper-covered nickel-iron wire known commercially as "Dumet" wire. At their adjacent ends the leads have cylindrical sealing portions 6, 8, which are of equal and somewhat enlarged diameter relative to the remainder of the leads, and form axially facing shoulders 10, 12. To enhance electrical and mechanical contact thereto, the sealing portion 6 includes on its end face at least partial covering of a metallic contact layer 14, preferably of copper, and the end face of sealing portion 8 is likewise at least partially covered with a similar contact layer 16. The contact layers 14, 16 are plated or otherwise adhered to the end faces of the leads so as to make a good minimum electrical resistance mechanically strong contact with the remaining portions of the leads.

Surrounding the sealing portions 6, 8 of the lead wires and enclosing the space between them is a cylinder 40 of glass which is hermetically sealed to the cylindrical surfaces of portions 6, 8 to complete the envelope of the diode. The cylinder 40 is preferably of a "soft" glass, having, for example, a working point of less than about 1000° C., and a softening point of less than about 750° C., such as Corning 0120 glass or Kimble GK12 glass.

Between the confronting contact layers 14, 16 is situated a wafer-like semiconductor pellet 18 of semiconductor material such as monocrystalline silicon or the like which contains an internal rectifying PN junction 20 between a P region 22 and an N region 24, and which is covered at one major face of the pellet 18 by an electrically insulative junction protecting and passivating layer 26 centrally apertured to expose region 22. The pellet 18 is mounted directly on the end face of either one of the wire leads by means of a solder layer 30 which is bonded to the major face of pellet 18 remote from layer 26 to copper layer 16. The solder 30 preferably consists essentially of a metal, such as silver, whose eutectic temperature with contact layer 16 is less than the sealing temperature of glass 40. Solder 30 can contain a small amount, such as 0.5 to 1%, of a donor impurity such as antimony, if desired, to preclude the formation of a rectifying contact between the pellet and the lead 4 to which it is attached.

The P region 22 of the pellet is mechanically and electrically connected to the end of lead 2 by a relatively thick cushion 32 of solder of a metallic composition whose coefficient of expansion is such that the aggregate thermal coefficient of expansion of the series structure formed by the pellet 18 and cushion 32 is from 50% to 150% the thermal coefficient of expansion of glass cylinder 40 within a desired temperature range such as −60° C. to 200° C. Cushion 32 also has a eutectic temperature with contact 14 less than, and a eutectic temperature with pellet 18 more than, the glass 40 sealing temperature. A preferred material for cushion 32 is silver. The cushion 32 is secured to the pellet 18 prior to assembly of the pellet to the leads by being plated on and alloyed therein in accordance with plating and alloying procedures known to those skilled in the art. If desired, a thin layer of gold may be plated on pellet 18 beneath cushion 32 to enhance the attachment of cushion 32 to the pellet.

The pellet 18 is preferably so dimensioned that the maximum dimension across its major face is slightly smaller than the inside diameter of the glass cylinder 40, for easy entrance of the pellet into cylinder 40. The diameter of lead wires 2, 4 may be, for example, 20 mils, the enlarged diameter sealing portions 6, 8 may each have a diameter of, for example, 32 mils and a length of 70 mils, and the internal diameter of the glass cylinder 40 prior to sealing may be, for example, 34 mils.

The structure above described lends itself particularly to an assembly sequence which is extremely simple and hence can be accomplished very economically. The lead wire 4 can be vertically supported on shoulder 12 by a suitable fixture with its sealing portion 8 inserted up into one end of the glass cylinder 40, and the pellet 18 with the solder layer 30 pre-attached and the cushion 32 pre-attached may be then simply dropped in the upper open end of the glass cylinder 40. Thereafter, the second lead wire 2 may be coaxially inserted into the upper end of the glass cylinder into contact with the cushion 32. The entire assembly may then be suitably heated for a brief period such as 25 seconds at 800° C. to cause the solder layer 30 to attach to end face 16 of lead 4, cushion 32 to attach to the end face 14 of lead 2, and the end portions of the glass cylinder 40 to soften and fuse into hermetic sealing contact with the sealing portions 6, 8 of the leads. The resistance to oxide formation of the silver in solder 30 and cushion 32 at such temperature particularly facilitates reliable assembly in this fashion. Any permanently deleterious effect on the pellet during the heating cycle is avoided by the short heating time required for complete assembly, and the relaitvely low temperatures sufficient to seal the soft glass and attach the solder layer 30 and cushion 32.

During the heat sealing of the diode, a slight amount of axial pressure may, if desired, be supplied to compress the pellet 18, solder 30 and cushion 32 between the wire leads. This facilitates making a good solder contact between the pellet, cushion 32 and layer 14 and between the layer 30 and layer 16 in an air atmosphere. For a contact region between the cushion 32 and a silicon pellet of, for example, a 4-mil diameter, an axial pressure of about 25 grams is found to be quite sufficient to insure good soldering in an air atmosphere, and the air atmosphere enhances sealing of the glass to lead portions 6, 8.

The diode construction above described has many advantages. Use of the relatively thick solder cushion 32 eliminates the need for the serpentine resilient connector heretofore frequently required to accommodate thermal expansion coefficient differences in diodes having glass envelopes. The pellet 18 with its solder portions 30, 32 attached does not need to be oriented end for end before insertion into the cylinder 40 because leads 2 and 4 are identical, and since the pellet 18 is dimensioned to have the maximum dimension of its major faces smaller than the inside diameter of the cylinder 40, pellet 18 can be simply dropped inside cylinder 40 and will land on the upfacing end of the wire lead therein automatically properly arranged and oriented for permanent attachment onto such end face. The pellet 18 does not require support from or contact with glass cylinder 40 but is attached to and supported exclusively by the confronting end faces of the wire leads.

Another advantage of the structure shown is that the direct connection of the pellet to the lead wire by the solder regions 30, 32 and the relatively large transverse dimensions of the solder region 30, insures a good thermal conductivity path from pellet 18 to the wire leads and thus makes it possible for the wire leads themselves to serve as excellent heat sinks for any heat generated in the pellet during electrical operation of the diode. The relatively thick cushion 32 also provides a sufficient axial spacing between the pellet and the confronting end of the wire lead 2 to keep the wire lead from touching the pellet at its edge if the wire lead end face happens to be other than exactly normal to the wire lead axis. Finally, the reduced interior volume of diode construction herein described gives it an inherently better resistance to crushing forces and hence makes it particularly suitable for eventual potting in an encapsulant with other circuit elements.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

What is claimed is:

1. In a semiconductor junction diode including a pair of axially extending metal leads having spaced transverse end faces, a metal contact layer at least partially covering the end face of each of said leads, and a pellet of semiconductor material situated between the end faces of said metal leads and having a P conductivity type region and an N conductivity type region each extending to a major face of said pellet, the improvement comprising:

(a) a soft glass cylinder axially encompassing said leads and fusibly sealed thereto to form a hermetic envelope therewith, said soft glass cylinder having a given sealing temperature range;

(b) a layer of metal solder bonded to a major face of said pellet forming with one of said contact layers an inter-metallic bond between said pellet and one of said leads, said layer of metal solder having a eutectic temperature with said one contact layer lower than the given sealing temperature range; and (c) a relatively thick electrically conductive cushion outstanding from the other major face of said pellet and bonded to both the other major face of said pellet and the other of said contact layers, said cushion having a first eutectic temperature with said other contact layer lower than the given sealing temperature range and having a second eutectic temperature with said pellet higher than the given sealing temperature range.

2. A semiconductor junction diode as in claim 1 wherein:

(a) said contact layers are copper;

(b) said layer of metal solder is predominantly silver;

(c) said cushion is predominantly silver; and (d) said pellet is of silicon.

3. A semiconductor junction diode as in claim 2 wherein:

(a) said glass cylinder has a given inside diameter and the maximum dimension of the major faces of said pellet is less than the given inside diameter of said cylinder; and (b) the axially series structure formed by said pellet and said cushion have an aggregate thermal coefficient of expansion from 50% to 150% of the portion of said glass cylinder surrounding said pellet and cushion.

References Cited

UNITED STATES PATENTS

| | | | |
|---|---|---|---|
| 2,939,058 | 5/1960 | Masterson | 317—236 |
| 2,982,892 | 5/1961 | Bender et al. | 317—234 |
| 3,110,080 | 11/1963 | Boyer et al. | 317—235 X |
| 3,141,226 | 7/1964 | Bender et al. | 317—234 X |
| 3,189,799 | 6/1965 | Moroney | 317—234 |
| 3,212,160 | 10/1965 | Dale et al. | 317—235 X |
| 3,261,075 | 7/1966 | Carman | 317—235 |

JOHN W. HUCKERT, *Primary Examiner.*

A. M. LESINACK, *Assistant Examiner.*